United States Patent
Kadota

(10) Patent No.: US 8,581,642 B2
(45) Date of Patent: Nov. 12, 2013

(54) DATA TRANSFER CIRCUIT

(75) Inventor: Daisuke Kadota, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 134 days.

(21) Appl. No.: 13/024,950

(22) Filed: Feb. 10, 2011

(65) Prior Publication Data

US 2011/0215853 A1 Sep. 8, 2011

(30) Foreign Application Priority Data

Mar. 8, 2010 (JP) ................................. 2010-050592

(51) Int. Cl.
*H03L 7/00* (2006.01)

(52) U.S. Cl.
USPC .......................................... 327/144; 327/141

(58) Field of Classification Search
USPC .......................................... 327/141, 144, 164
See application file for complete search history.

(56) References Cited

U.S. PATENT DOCUMENTS 6,489,833 B1 * 12/2002 Miyazaki et al. ............. 327/534

FOREIGN PATENT DOCUMENTS

JP 02-180419 7/1990

* cited by examiner

*Primary Examiner* — Lincoln Donovan
*Assistant Examiner* — Diana J Cheng
(74) *Attorney, Agent, or Firm* — Studebaker & Brackett PC

(57) ABSTRACT

A data transfer circuit includes primary data holding circuits that hold input data according to a first clock pulse signal and output data being held; and secondary data holding circuits that hold the output data of the primary data holding circuits according to a second clock pulse asynchronous to the first clock pulse and output data being held. Pulse signal generator generates a pulse signal synchronous with the second clock pulse signal when a pulse edge of the first clock pulse signal and a pulse edge of the second clock pulse signal occur at different timings and generates a pulse signal having the pulse edge the second clock pulse signal removed therefrom when the pulse edge of the the first clock pulse signal and the pulse edge of the the second clock pulse signal occur at the same timing. The secondary data holding circuits hold the output data of the primary data holding circuits synchronously with the pulse signal generated by the pulse signal generator.

5 Claims, 7 Drawing Sheets

DATA TRANSFER CIRCUIT

BACKGROUND OF THE INVENTION

1. Field of the Invention

The present invention relates to a data transfer device comprising a plurality of data holding circuits connected in cascade.

2. Description of the Related Art

FIG. 1 shows the configuration of a data transfer circuit comprising primary flip-flops FF1-1 and FF1-2 that operate synchronously with first clock pulse signal CLK1, and secondary flip-flops FF2-1 and FF2-2 that operate synchronously with second clock pulse signal CLK2 asynchronous to the CLK1.

FIG. 2 is a timing chart showing an operation of the data transfer circuit shown in FIG. 1. As shown in FIG. 2, the primary flip-flops FF1-1 and FF1-2 hold input data $D_{1-1}$ and $D_{1-2}$ respectively at the rising timing of the first clock pulse signal CLK1 to output these as data $D_{2-1}$ and $D_{2-2}$ respectively. The secondary flip-flops FF2-1 and FF2-2 hold the data $D_{2-1}$ and $D_{2-2}$ output from the primary flip-flops FF1-1 and FF1-2 respectively at the rising timing of the second clock pulse signal CLK2 to output these as data $D_{3-1}$ and $D_{3-2}$ respectively.

For example, there is disclosed a date rate conversion circuit in a Japanese Patent Application Laid-Open Publication No. H02-180419.

FIG. 3 is a timing chart showing the operation of the data transfer circuit having the above configuration when a first clock pulse signal CLK1 and a second clock pulse signal CLK2 rise at substantially the same timing.

As shown in FIG. 3, the primary flip-flops FF1-1 and FF1-2 can hold data $D_{1-1}$ and $D_{1-2}$ respectively synchronously with the first clock pulse signal CLK1. Meanwhile, the data hold operation in the secondary flip-flops FF2-1 and FF2-2 becomes unstable because the timing at which the data $D_{2-1}$ and $D_{2-2}$ are output from the primary flip-flops substantially coincides with the rising timing of the second clock pulse signal CLK2. For example, it may be that the flip-flop FF2-1 cannot perform the hold operation synchronous with the second clock pulse signal CLK2 and continues to output the value held since before the CLK2 rose, whereas the flip-flop FF2-2 outputs the value that has got held synchronously with the second clock pulse signal CLK2. That is, with the conventional data transfer circuit, there is the problem that if clock pulse signals CLK1 and CLK2 contend, the outputs of the secondary flip-flops FF2-1 and FF2-2 may not match.

SUMMARY OF THE INVENTION

The present invention was made in view of the above fact, and an object thereof is to provide a data transfer circuit that can prevent a mismatch between the outputs of secondary flip-flops when clock pulse signals generated independently of each other contend as described above.

According to the present invention, there is provided a data transfer circuit including primary data holding circuits that hold input data according to a first clock pulse signal and output data being held; and secondary data holding circuits that hold the output data of the primary data holding circuits according to a second clock pulse signal asynchronous to the first clock pulse signal and output data being held. The data transfer circuit further comprises pulse signal generator that generates a pulse signal synchronous with the second clock pulse signal when a pulse edge of the first clock pulse signal and a pulse edge of the second clock pulse signal occur at different timings and generates a pulse signal having the pulse edge of the second clock pulse signal removed therefrom when the pulse edge of the first clock pulse signal and the pulse edge of the second clock pulse signal occur at the same timing. The secondary data holding circuits hold the output data of the primary data holding circuits synchronously with the pulse signal generated by the pulse signal generator.

According to the data transfer circuit of the present invention, in data holding circuits including primary flip-flops and secondary flip-flops which operate with clock pulse signals independent of, and asynchronous to, each other, even when the clock pulse signals contend, a mismatch between the outputs of the secondary flip-flops can be prevented.

DETAILED DESCRIPTION OF THE INVENTION

An embodiment of the present invention will be described below with reference to the drawings.

Figure 1:
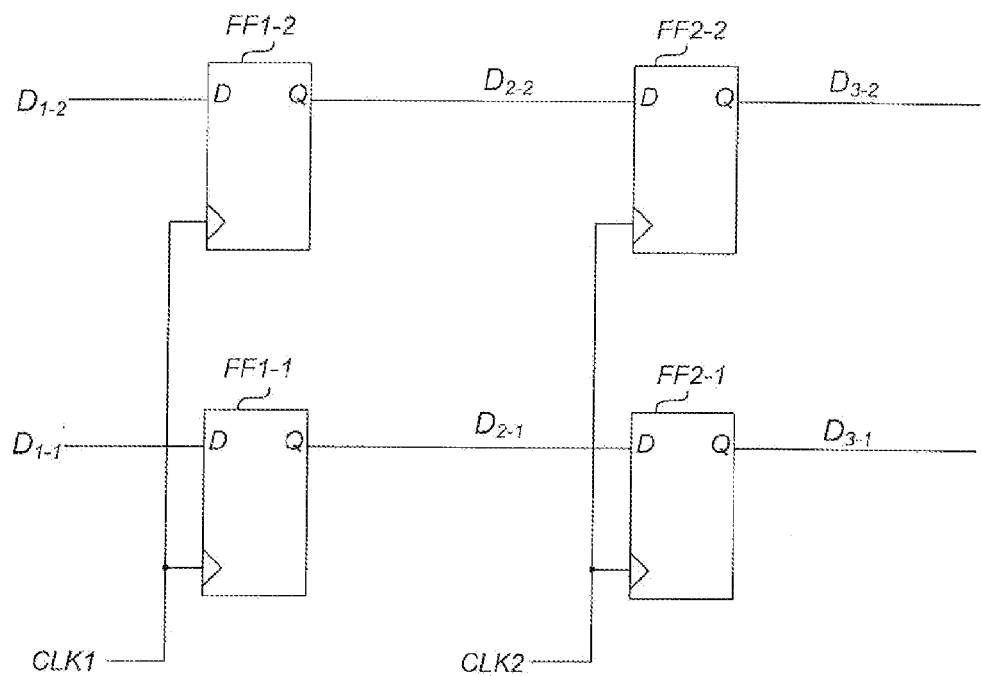
FIG. 1 is a block diagram showing the configuration of a conventional data transfer circuit.
Figure 2:
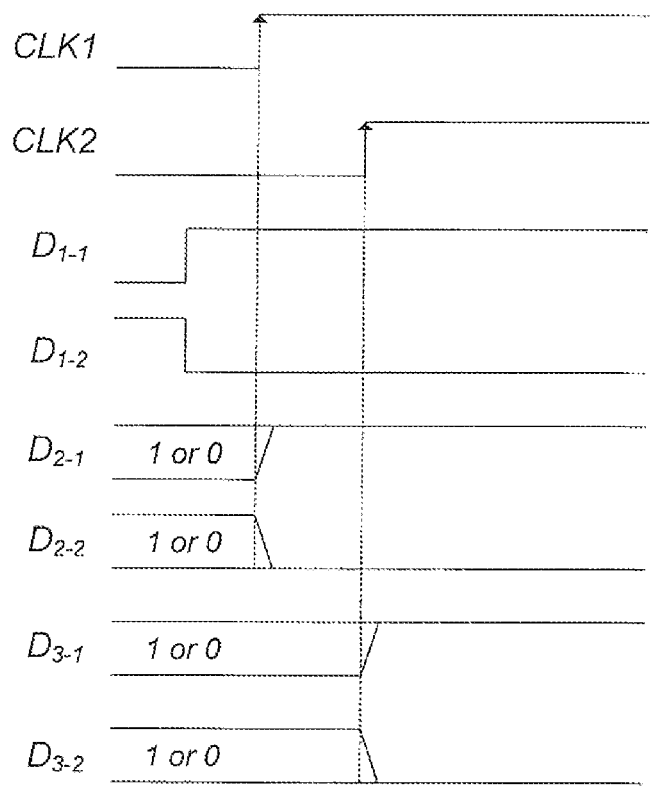
FIG. 2 is a timing chart showing an operation of the conventional data transfer circuit.
Figure 3:
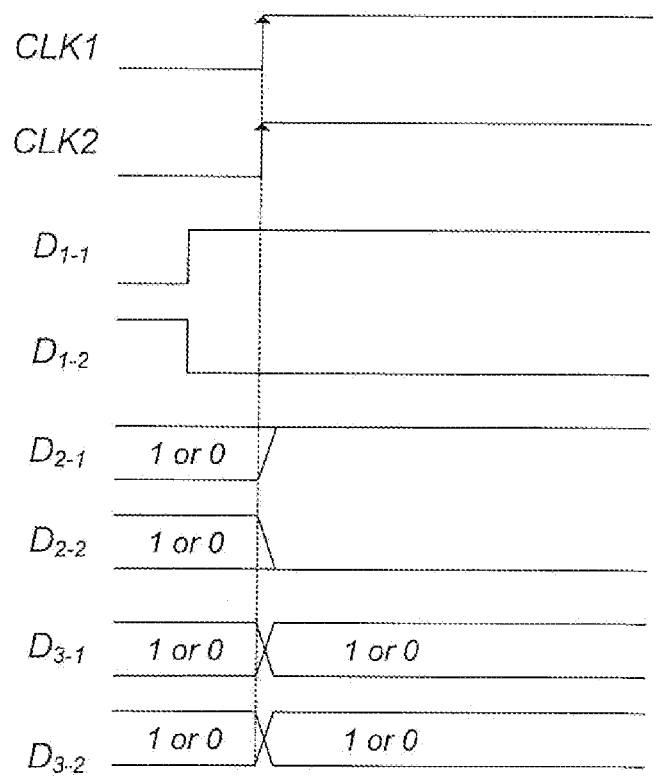
FIG. 3 is a timing chart showing an operation of the conventional data transfer circuit.
Figure 4:
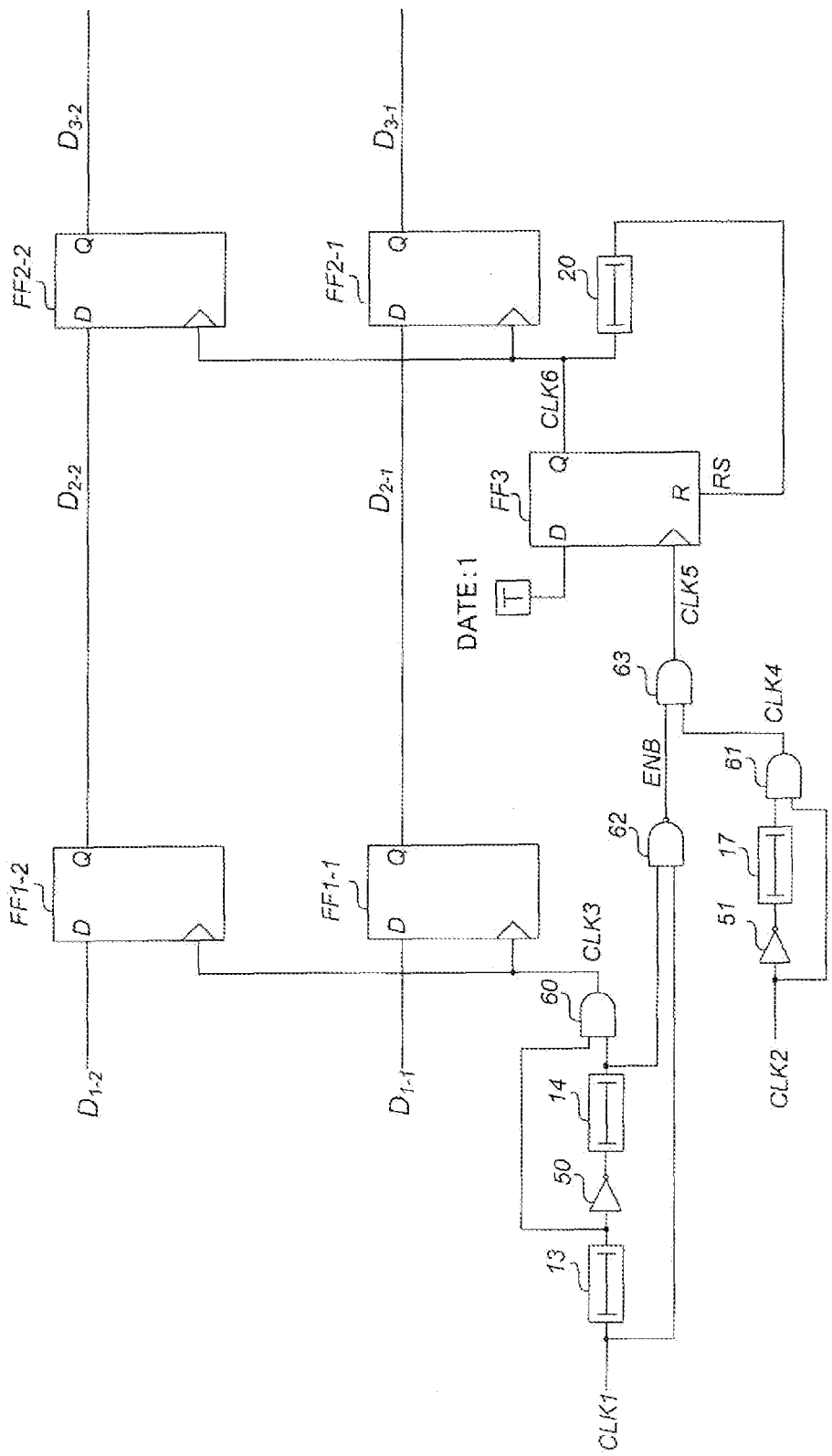
FIG. 4 is a block diagram showing the configuration of a data transfer circuit according to an embodiment of the present invention.

FIG. 4 is a block diagram showing the configuration of a data transfer circuit according to an embodiment of the present invention. As in the conventional configuration, a flip-flop FF1-1 (hereinafter called FF1-1) and a flip-flop FF2-1 (hereinafter called FF2-1) are connected in cascade, and a flip-flop FF1-2 (hereinafter called FF1-2) and a flip-flop FF2-2 (hereinafter called FF2-2) are connected in cascade. The primary flip-flops FF1-1 and FF1-2 operate based on first clock pulse signal CLK1 (hereinafter also called simply CLK1), but the CLK1 is converted by pulse signal generating means comprising delay elements 13 and 14, etc., into a clock pulse signal CLK3 (hereinafter simply called CLK3), which is supplied to the FF1-1 and FF1-2. Meanwhile, the secondary flip-flops FF2-1 and FF2-2 operate based on second clock pulse signal CLK2 (hereinafter simply called CLK2), but the CLK2 is converted by pulse signal generating means comprising a delay element 17, a flip-flop FF3 (hereinafter simply called FF3), etc., into a clock pulse signal CLK6 (hereinafter simply called CLK6), which is supplied to the FF2-1 and FF2-2.

The first clock pulse signal CLK1 is supplied through the delay element 13, an inverter 50, and the delay element 14 to one input of an AND circuit 60. The output of the delay element 13 is input to the other input of the AND circuit 60. The AND circuit 60 outputs the logical product of these two input signals as the CLK3, supplying CLK3 to the FF1-1 and FF1-2.

The second clock pulse signal CLK2 is supplied through an inverter 51 and the delay element 17 to one input of an AND circuit 61. The CLK2 is supplied as it is to the other input of the AND circuit 61. The AND circuit 61 outputs the logical product of these two input signals as a clock pulse signal CLK4 (a second pulse signal).

Meanwhile, the CLK1 is supplied to one input of a NAND circuit 62. The output of the delay element 14 is supplied to the other input of the NAND circuit 62. The NAND circuit 62 outputs the negative logical product of these two input signals as an enable signal ENB (a first pulse signal). The enable signal ENB and CLK4 are supplied to an AND circuit 63. The AND circuit 63 outputs the logical product of these two input signals as a clock pulse signal CLK5 (a third pulse signal). The enable signal ENB is a control signal to prohibit outputting the high level signal in CLK5 at the timing when the primary flip-flops FF1-1 and FF1-2 are starting to hold synchronously with the CLK3.

The FF3 outputs a logical value of "1" at the rising timing of CLK5 and is reset to output a logical value of "0" by a reset signal RS into which the output signal of the FF3 is delayed by a delay element 20. The output signal of the FF3 is supplied as a clock pulse signal CLK6 (a fourth pulse signal) to the secondary flip-flops FF2-1 and FF2-2. Data of "1" is consistently input to the data input terminal of the FF3.

The operation of the data transfer circuit of the present embodiment having the above configuration will be described below. First, the operation when the first clock pulse signal CLK1 and the second clock pulse signal CLK2 do not contend, namely, when the edges of pulses of these clock pulse signals occur at different timings will be described with reference to the flow chart shown in FIG. 5.

The clock pulse signal CLK3 and the enable signal ENB are generated in response to the rising of the first clock pulse signal CLK1. The CLK3 rises later by a delay time D1 given by the delay element 13 than the rising of the CLK1 and maintains its logical value at "1" for a period of a delay time D2 given by the delay element 14. The CLK3 is supplied to the primary flip-flops FF1-1 and FF1-2. The ENB falls at the rising timing of the CLK1 and maintains its logical value at "0" for a period of the sum of the delay times D1 and D2.

The clock pulse signal CLK4 is generated in response to the rising of the second clock pulse signal CLK2. The CLK4 rises at the rising timing of the CLK2 and maintains its logical value at "1" for a period of a delay time D3 given by the delay element 17.

At the rising timing of the CLK4, the ENB is back at the logical value of "1", and hence the CLK4 is output as it is as the clock pulse signal CLK5 via the AND circuit 63 and supplied to the FF3. The clock pulse signal CLK6, which rises at the rising timing of the CLK5 and maintains its logical value at "1" for a period of a delay time D4 given by the delay element 20, is generated by the FF3 and supplied to the secondary flip-flops FF2-1 and FF2-2.

Figure 5:
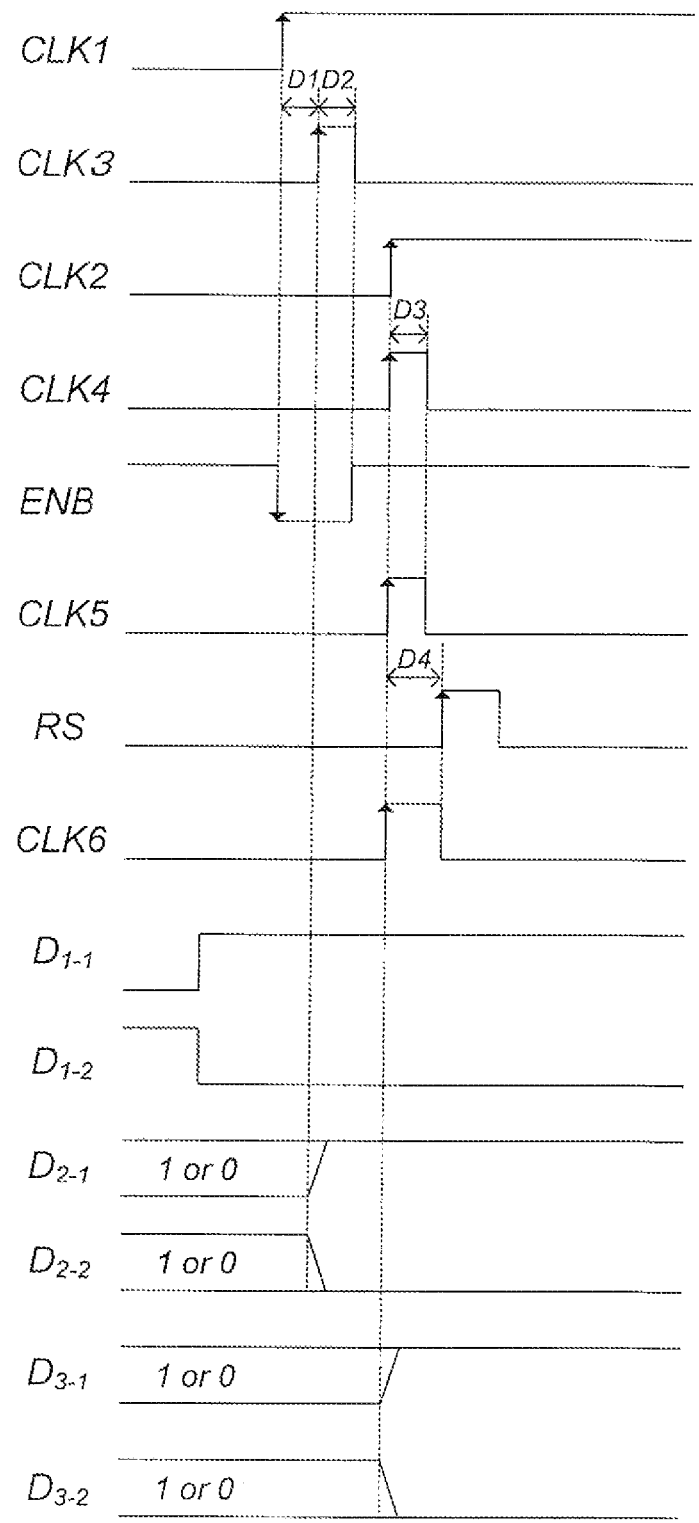
FIG. 5 is a timing chart showing an operation of the data transfer circuit according to the embodiment of the present invention.

It is assumed that at the timing shown in FIG. 5, data $D_{1-1}$ starts to be supplied to the primary flip-flop FF1-1 and that data $D_{1-2}$, into which the data $D_{1-1}$ is inverted, starts to be supplied to the primary flip-flop FF1-2. The primary flip-flops FF1-1 and FF1-2 hold the data $D_{1-1}$ and data $D_{1-2}$ respectively at the rising edge of the pulse of the CLK3 generated based on the CLK1 to output these as data $D_{2-1}$ and data $D_{2-2}$.

The secondary flip-flops FF2-1 and FF2-2 hold the data $D_{2-1}$ and data $D_{2-2}$ output from the primary flip-flops FF1-1 and FF1-2 respectively at the rising edge of the pulse of the CLK6 generated based on the CLK1 and CLK2 to output these as data $D_{3-1}$ and data $D_{3-2}$.

As such, according to the data transfer circuit of the present embodiment, when the CLK1 and the CLK2 do not contend, the secondary flip-flops FF2-1 and FF2-2 can appropriately hold the data $D_{2-1}$ and data $D_{2-2}$ from the primary flip-flops FF1-1 and FF1-2 according to the CLK2 and output the data $D_{3-1}$ and data $D_{3-2}$.

Next, the operation for a first example where the first clock pulse signal CLK1 and the second clock pulse signal CLK2 contend, namely, where these clock pulse signals rise at substantially the same timing will be described with reference to the flow chart shown in FIG. 6.

The CLK3 and the ENB are generated in response to the rising of the first clock pulse signal CLK1. The CLK3 rises later by the delay time D1 given by the delay element 13 than the rising of the CLK1 and maintains its logical value at "1" for a period of the delay time D2 given by the delay element 14. The CLK3 is supplied to the primary flip-flops FF1-1 and FF1-2. The ENB falls at the rising timing of the CLK1 and maintains its logical value at "0" for a period of the sum of the delay times D1 and D2.

The CLK4 is generated in response to the rising of the CLK2. The CLK4 rises at the rising timing of the CLK2 and maintains its logical value at "1" for a period of the delay time D3 given by the delay element 17.

During the period when the CLK4 maintains its logical value at "1", the ENB maintains its logical value at "0". Hence, the CLK5 maintains its logical value at "0", and thus, the CLK6 also maintains its logical value at "0".

Figure 6:
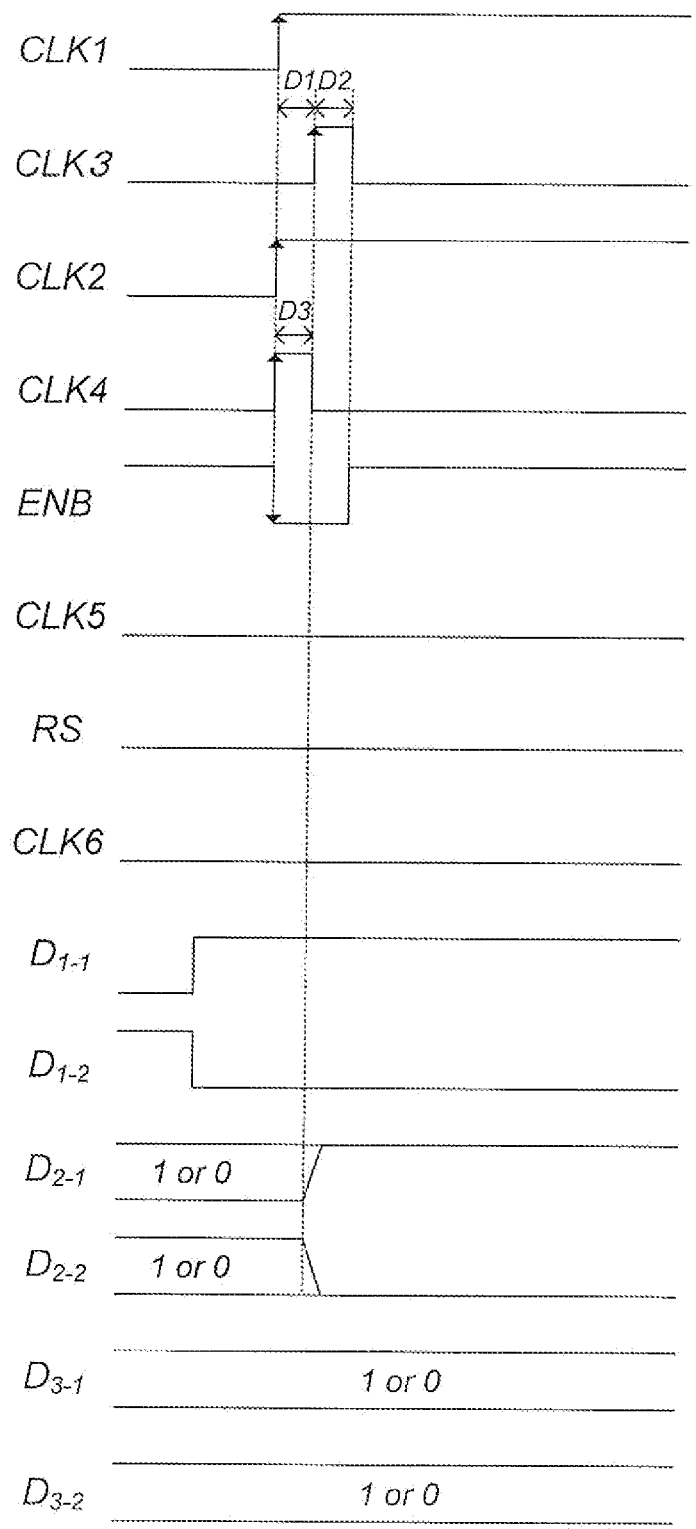
FIG. 6 is a timing chart showing an operation of the data transfer circuit according to the embodiment of the present invention.

It is assumed that at the timing shown in FIG. 6, data $D_{1-1}$ starts to be supplied to the primary flip-flop FF1-1 and that data $D_{1-2}$, into which the data $D_{1-1}$ is inverted, starts to be supplied to the primary flip-flop FF1-2. The primary flip-flops FF1-1 and FF1-2 hold the data $D_{1-1}$ and data $D_{1-2}$ respectively at the rising edge of the pulse of the CLK3 generated based on the CLK1 to output these as data $D_{2-1}$ and data $D_{2-2}$.

The data $D_{2-1}$ and data $D_{2-2}$ output from the primary flip-flops FF1-1 and FF1-2 are supplied to the secondary flip-flops FF2-1 and FF2-2. However, because the CLK6 maintains its logical value at "0", the secondary flip-flops FF2-1 and FF2-2 do not hold the data $D_{2-1}$ and data $D_{2-2}$ supplied from the primary flip-flops FF1-1 and FF1-2, but continue to hold and output the values held since before the CLK2 rose. As such, according to the data transfer circuit of the present embodiment, when the first clock pulse signal CLK1 and the second clock pulse signal CLK2 rise at substantially the same timing, the CLK6 having the rising edge of the pulse of the CLK2 removed therefrom is generated and supplied to the secondary flip-flops FF2-1 and FF2-2. In other words, the pulse of the CLK2 having the edge contending the edge of the pulse of the CLK1 is removed from the CLK2 by a pulse signal generator comprising the delay elements 13, 14, 17, 20, AND circuits 60, 61, 63, the flip-flop FF3, and so on. Thereby, the secondary flip-flops FF2-1 and FF2-2 are prevented from holding new data according to the second clock pulse signal CLK2, and hence a mismatch between the outputs of the FF2-1 and FF2-2 can be prevented.

Next, the operation for a second example where the first clock pulse signal CLK1 and the second clock pulse signal CLK2 contend, namely, where the CLK2 rises slightly later than the rising of the CLK1 will be described with reference to the flow chart shown in FIG. 7.

The CLK3 and the ENB are generated in response to the rising of the CLK1. The CLK3 rises later by the delay time D1 given by the delay element 13 than the rising of the CLK1 and maintains its logical value at "1" for a period of the delay time D2 given by the delay element 14. The CLK3 is supplied to the primary flip-flops FF1-1 and FF1-2. The ENB falls at the rising timing of the CLK1 and maintains its logical value at "0" for a period of the sum of the delay times D1 and D2.

The CLK4 is generated in response to the rising of the CLK2. The CLK4 rises at the rising timing of the CLK2 and maintains its logical value at "1" for a period of the delay time D3 given by the delay element 17.

Figure 7:
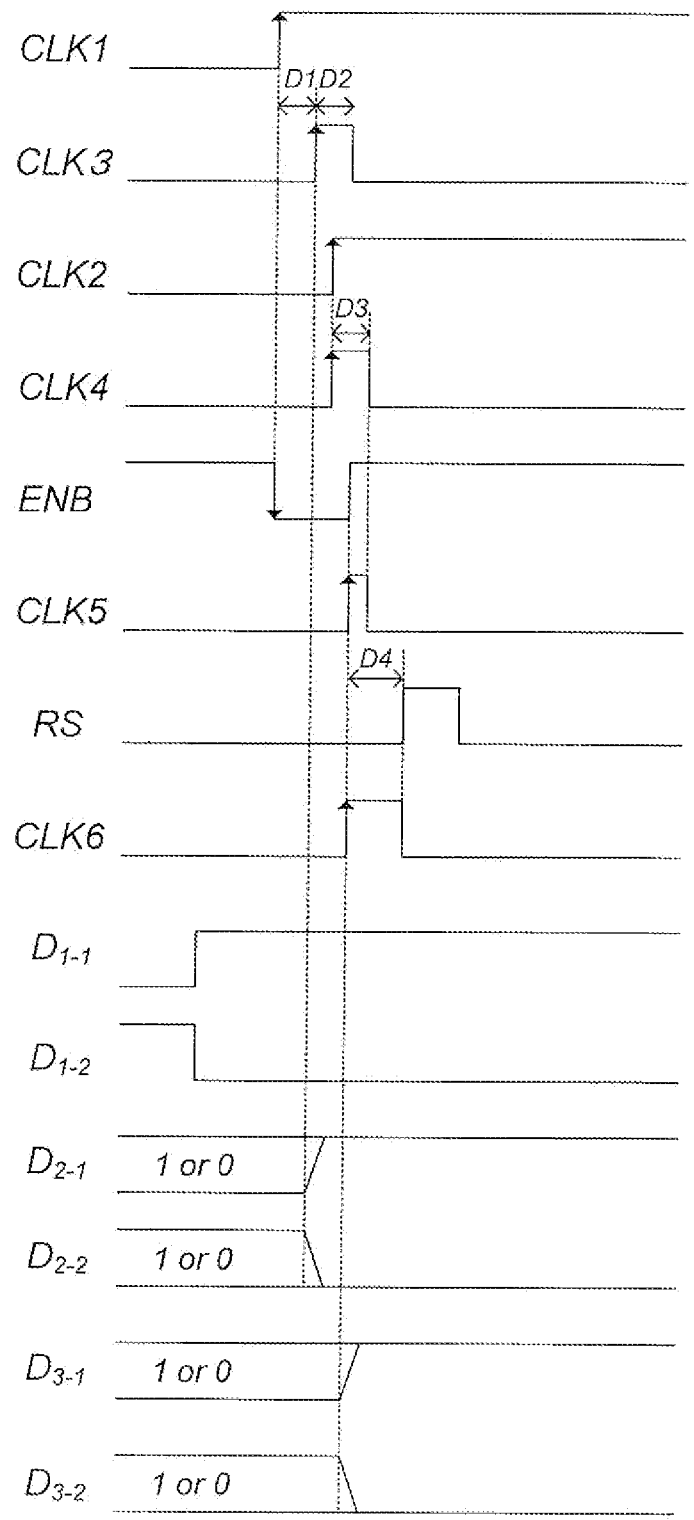
FIG. 7 is a timing chart showing an operation of the data transfer circuit according to the embodiment of the present invention.

At the rising timing of the CLK4, the ENB is maintaining its logical value at "0", but before the CLK4 falls, the ENB switches its logical value to "1", and hence the CLK5 has a whisker-like pulse as shown in FIG. 7. The CLK5 is supplied to the FF3. If the pulse of CLK5 has an enough pulse width to be recognized by the FF3, the clock pulse signal CLK6, which rises at the rising timing of the CLK5 and maintains its logical value at "1" for a period of the delay time D4 given by the delay element 20, is generated by the FF3 and supplied to the secondary flip-flops FF2-1 and FF2-2. That is, even where the CLK5 has a whisker-like pulse because there is a slight time difference between the rising timings of the CLK1 and CLK2, the FF3, which detects the edge of the pulse of the input signal to generate the CLK6, stably supplies the clock pulse signal to the secondary flip-flops FF2-1 and FF2-2. Note that if the pulse width of the pulse of the CLK5 is so small as to be not recognized by the FF3, the CLK6 maintains its logical value at "0".

It is assumed that at the timing shown in FIG. 7, data $D_{1-1}$ starts to be supplied to the primary flip-flop FF1-1 and that data $D_{1-2}$, into which the data $D_{1-1}$ is inverted, starts to be supplied to the primary flip-flop FF1-2. The primary flip-flops FF1-1 and FF1-2 hold the data $D_{1-1}$ and data $D_{1-2}$ respectively at the rising edge of the pulse of the CLK3 generated based on the CLK1 to output these as data $D_{2-1}$ and data $D_{2-2}$.

The secondary flip-flops FF2-1 and FF2-2 hold the data $D_{2-1}$ and data $D_{2-2}$ respectively at the rising edge of the pulse of the CLK6 generated based on the CLK1 and CLK2 to output these as data $D_{3-1}$ and data $D_{3-2}$. If the CLK5 is not recognized by the FF3, the secondary flip-flops FF2-1 and FF2-2 do not hold the data $D_{2-1}$ and data $D_{2-2}$ supplied from the primary flip-flops FF1-1 and FF1-2, but continue to hold and output the values held since before the CLK2 rose. As such, according to the data transfer circuit of the present embodiment, even where the CLK5 has a whisker-like pulse because there is a slight time difference between the rising timings of the first clock pulse signal CLK1 and the second clock pulse signal CLK2, the CLK6 having a pulse of a predetermined pulse width is supplied to the secondary flip-flops FF2-1 and FF2-2. If the CLK5 is not recognized by the FF3, the CLK6 is controlled to maintain its logical value at "0". Thus, a mismatch between the outputs of the secondary flip-flops FF2-1 and FF2-2 can be prevented.

As apparent from the above description, according to the data transfer circuit of the present embodiment, when the first clock pulse signal CLK1 and the second clock pulse signal CLK2 asynchronous to CLK1 rise at substantially the same timing, the clock pulse signal CLK6 having the rising edge of the pulse of the second clock pulse signal CLK2 removed therefrom is generated and supplied to the secondary flip-flops FF2-1 and FF2-2. Thereby, the secondary flip-flops FF2-1 and FF2-2 are prevented from holding new data according to the second clock pulse signal CLK2, and hence a mismatch between the outputs of the FF2-1 and FF2-2 can be prevented. Further, even where there is a slight time difference between the rising timings of the first clock pulse signal CLK1 and the second clock pulse signal CLK2, a mismatch between the outputs of the FF2-1 and FF2-2 can be prevented.

The present invention has been described above with reference to a preferred embodiment thereof. It should be understood that those skilled in the art can think of various modifications and alterations. It is contemplated that the scope of the appended claims includes all such modifications and alterations.

This application is based on Japanese Patent Application No. 2010-050592, which is herein incorporated by reference.

What is claimed is:

1. A data transfer circuit comprising:
    primary data holding circuits that hold input data according to a first clock pulse signal and output data being held; and
    secondary data holding circuits that hold the output data of said primary data holding circuits according to a second clock pulse signal having a pulse width different from a pulse width of said first clock pulse signal and output data being held, said data transfer circuit further includes:
    pulse signal generator that compares timings of pulse edges of said first clock pulse signal and said second clock pulse signal, generates a pulse signal corresponding to said second clock pulse signal when a pulse edge of said first clock pulse signal and a pulse edge of said second clock pulse signal occur at different timings and generates a pulse signal having the pulse edge of said second clock pulse signal removed therefrom when the pulse edge of said first clock pulse signal and the pulse edge of said second clock pulse signal occur at the same timing,
    wherein said secondary data holding circuits hold the output data of said primary data holding circuits synchronously with the pulse signal generated by said pulse signal generator.

2. A data transfer circuit according to claim 1, wherein said pulse signal generator comprises:
    a first pulse signal generator that generates a first pulse signal that falls at the timing when the pulse edge of said first clock pulse signal occurs and maintains its signal level at a low level for a predetermined period;
    a second pulse signal generator that generates a second pulse signal that rises at the timing when the pulse edge of said second clock pulse signal occurs and maintains its signal level at a high level for a predetermined period;
    a third pulse signal generator that generates a logical product of said first pulse signal and said second pulse signal as a third pulse signal; and
    a fourth pulse signal generator that generates a forth pulse signal that rises at the timing when a pulse edge of said third pulse signal occurs and maintains its signal level at a high level for a predetermined period,
    wherein said pulse signal generator supplies said fourth pulse signal to said secondary data holding circuits.

3. A data transfer circuit according to claim 2, wherein said fourth pulse signal generator comprises a flip-flop for generating said fourth pulse signal which rises at the timing when the pulse edge of said third pulse signal occurs.

4. A data transfer circuit according to claim 2, wherein said first, second, and fourth pulse signal generators include delay elements for delaying timings of data transfer respectively, and the pulse widths of said first, second, and fourth pulse signals are determined by delay times given by said delay elements.

5. A data transfer method using a data transfer circuit which includes primary data holding circuits that holds input data according to a first clock pulse signal and output data being held, secondary data holding circuits that hold the output data of said primary data holding circuits according to a second clock pulse signal having a pulse width different from a pulse width of said first clock pulse signal and output data being held, said data transfer method comprising:

compares timings of pulse edges of said first clock pulse signal and said second clock pulse signal;

holding said output data in said secondary data holding circuits at a timing corresponding to a pulse edge of said second clock pulse signal when a pulse edge of said first clock pulse signal and the pulse edge of said second clock pulse signal occur at timings outside a predetermined range; and aborting the holding of said output data in said secondary data holding circuit at the timing corresponding to the pulse edge of said second pulse signal when the pulse edge of said first clock pulse signal and the pulse edge of said second clock pulse signal occur at timing within the predetermined range.

* * * * *